United States Patent
He et al.

(10) Patent No.: US 10,075,180 B2
(45) Date of Patent: Sep. 11, 2018

(54) CIRCUITS AND METHODS FOR INTER-SYMBOL INTERFERENCE COMPENSATION

(71) Applicant: MediaTek Inc., Hsin-Chu (TW)

(72) Inventors: Tao He, Corvallis, OR (US); Michael A. Ashburn, Jr., Groton, MA (US)

(73) Assignee: MediaTek Inc., Hsin-Chu (TW)

(*) Notice: Subject to any disclaimer, the term of this patent is extended or adjusted under 35 U.S.C. 154(b) by 0 days.

(21) Appl. No.: 15/809,476

(22) Filed: Nov. 10, 2017

(65) Prior Publication Data

US 2018/0212617 A1  Jul. 26, 2018

Related U.S. Application Data

(60) Provisional application No. 62/556,851, filed on Sep. 11, 2017, provisional application No. 62/448,416, filed on Jan. 20, 2017.

(51) Int. Cl.
  *H03M 1/10*  (2006.01)
  *H03M 3/00*  (2006.01)

(52) U.S. Cl.
  CPC ........... *H03M 3/322* (2013.01); *H03M 3/424* (2013.01); *H03M 3/464* (2013.01)

(58) Field of Classification Search
  CPC ....... H03M 3/322; H03M 3/464; H03M 3/424
  USPC ......................................... 341/120, 118, 155
  See application file for complete search history.

(56) References Cited

U.S. PATENT DOCUMENTS

| | | | | |
|---|---|---|---|---|
| 6,930,624 B2* | 8/2005 | Hezar | ................... | H03M 3/322 341/143 |
| 8,320,443 B2* | 11/2012 | Agazzi | ............... | G01R 31/3004 375/233 |
| 8,619,848 B2* | 12/2013 | Jiang | ................. | H04L 25/03057 375/220 |
| 8,811,528 B2* | 8/2014 | Hughes | ............. | H04L 25/03343 375/219 |
| 9,047,205 B1* | 6/2015 | Chen | ....................... | G06F 12/00 |
| 9,065,463 B2* | 6/2015 | Rajasekhar | ............. | H03M 1/08 |

(Continued)

OTHER PUBLICATIONS

Extended European Search Report for Application No. EP 18152518.9 dated Jun. 20, 2018.

(Continued)

*Primary Examiner* — Brian Young
(74) *Attorney, Agent, or Firm* — Wolf, Greenfield & Sacks, P.C.

(57) ABSTRACT

Circuits and methods for inter-symbol interference compensation are described. These circuits and methods may be used in connection with delta-sigma analog-to-digital converter. During a sensing phase, a value indicative of the inter-symbol interference may be sensed. The value may be obtained by (1) causing the ADC to generate a first number of transitions during a first time interval; (2) causing the ADC to generate a second number of transitions during a second time interval; (3) sensing the number of logic-0s and logic-1s occurring in the first and second time intervals; and (4) computing the value based at least in part on the number of logic-0s and logic-1s occurring in the first and second time intervals. During a compensation phase, inter-symbol interference may be compensated based on the value obtained in the sensing phase.

20 Claims, 12 Drawing Sheets

(56) References Cited

U.S. PATENT DOCUMENTS

2009/0316767 A1  12/2009  Hidaka

OTHER PUBLICATIONS

He et al., A 50MHz-BW Continuous-Time ΔΣ ADC with Dynamic Error Correction Achieving 79.8dB SNDR and 95.2dB SFDR. IEEE International Solid-State Circuits Conference. Feb. 13, 2018;230-2.
Tiew et al., DAC Compensation for Continuous-Time Delta-Sigma Modulators. IEEE. 2005;3680-3.

* cited by examiner

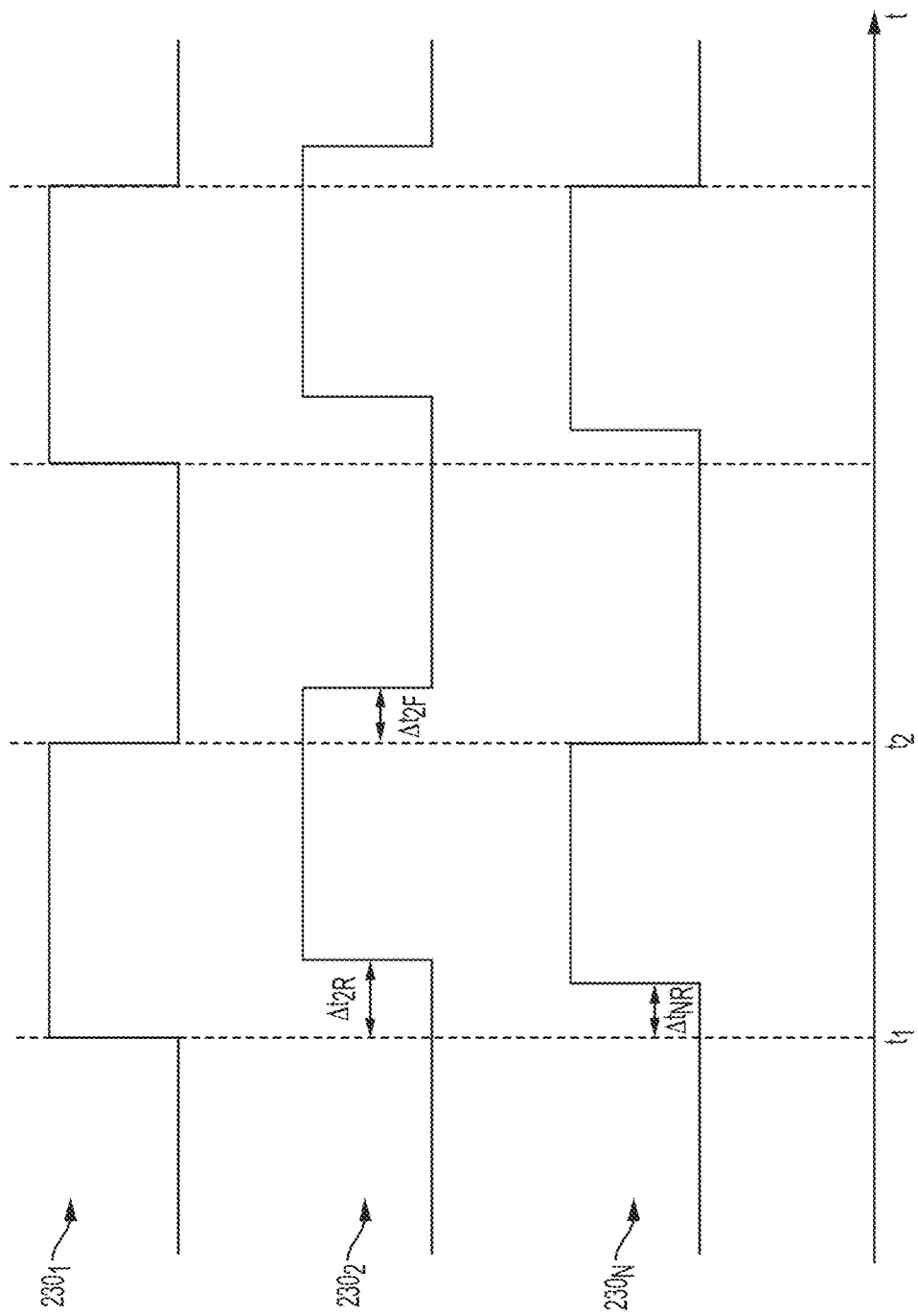

CIRCUITS AND METHODS FOR INTER-SYMBOL INTERFERENCE COMPENSATION

RELATED APPLICATIONS

This Application claims priority under 35 U.S.C. § 119(e) to U.S. Provisional Application Ser. No. 62/448,416, entitled "ISI ERROR MEASUREMENT AND COMPENSATION" filed on Jan. 20, 2017, which is herein incorporated by reference in its entirety and claims priority under 35 U.S.C. § 119(e) to U.S. Provisional Application Ser. No. 62/556,851, entitled "CIRCUITS AND METHODS FOR INTER-SYMBOL INTERFERENCE COMPENSATION" filed on Sep. 11, 2017, which is herein incorporated by reference in its entirety

TECHNICAL FIELD

The present application relates to delta-sigma analog-to-digital converters.

BACKGROUND

Delta-sigma analog-to-digital converters (ADC) use integrators and feedback loops to filter noise in the low frequencies, so as to enhance signal-to-noise ratio. Some delta-sigma ADCs include 1-bit digital-to-analog converters (DAC) in the feedback loop. Other delta-sigma ADCs include multi-bit DACs. These DACs typically provide higher digitization resolutions.

BRIEF SUMMARY

According to one aspect of the present application, a method for compensating a circuit for inter-symbol interference (ISI) is provided. The method may comprise: in a first time interval, causing the circuit to generate a first data stream having a first number of transitions, and determining a first number of zeros and/or ones that are output by the circuit in the first time interval; in a second time interval, causing the circuit to generate a second data stream having a second number of transitions, and determining a second number of zeros and/or ones that are output by the circuit in the second time interval; determining a value indicative of an ISI by comparing the first number of zeros and/or ones with the second number of zeros and/or ones; and compensating the circuit for inter-symbol interference based on the value.

In some embodiments, the circuit comprises an analog-to-digital converter (ADC).

In some embodiments, the ADC comprises a delta-sigma ADC.

In some embodiments, the first time interval has a first duration and the second time interval has a second duration that is substantially equal to the first duration.

In some embodiments, determining the value indicative of the ISI error comprises searching a look up table.

In some embodiments, causing the circuit to generate the first data stream and causing the circuit to generate the second data stream comprises introducing a dither signal.

In some embodiments, the ISI arises in a digital-to-analog converters (DAC).

In some embodiments, the method further comprises converting the first and second data streams into the analog domain through one or more digital-to-analog converters (DAC).

In some embodiments, compensating the circuit comprises controlling a time at which a rising edge or a falling edge occurs.

According to another aspect of the present application, a circuit is provided. The circuit may comprise an integrator, an N-bit quantizer coupled to an output of the integrator, wherein N is greater than or equal to 1; a feedback loop coupled between an output of the N-bit quantizer and an input of the integrator, the feedback loop comprising one or more digital-to-analog converters (DAC); a compensation circuit coupled to the one or more DACs; and control circuitry configured to measure an ISI arising in the one or more DACs and to control the compensation circuit based on the ISI.

In some embodiments, the integrator, the feedback loop, the multi-level comparator and the plurality of DACs form a delta-sigma analog-to-digital converter (ADC).

In some embodiments, each of the one or more DACs comprises a single-bit DAC.

In some embodiments, the control circuitry is configured to measure the ISI by: in a first interval, generating a first data stream having a first number of transitions, and determining a first number of zeros and/or ones that are part of the first data stream in the first time interval; in a second time interval, generating a second data stream having a second number of transitions, and determining a second number of zeros and/or ones that are part of the second data stream in the second time interval.

In some embodiments, the first time interval has a first duration and the second time interval has a second duration that is substantially equal to the first duration.

In some embodiments, the control circuitry is further configured to determine the ISI error by determining a value indicative of the ISI by comparing the first number of zeros and/or ones with the second number of zeros and/or ones.

According to yet another aspect of the present application, a delta-sigma modulator is provided. The delta-sigma modulator may comprise a conversion path comprising a low-pass filter, and an N-bit quantizer coupled to an output of the integrator, wherein N is greater than or equal to 1; a sensing path comprising a 1-bit quantizer; circuitry for activating the conversion path during a conversion phase and for activating the sensing path during a sensing phase; a feedback loop coupled between an output of the N-bit quantizer and an input of the integrator, the feedback loop comprising one or more digital-to-analog converters (DAC); and a compensation circuit coupled to the one or more DACs.

In some embodiments, the low-pass filter is an integrator.

In some embodiments, the compensation circuit comprises one or more trimming circuits configured to control timing of a rising edge and/or a falling edge.

In some embodiments, the sensing path further comprises a controllable device.

In some embodiments, the delta-sigma modulator further comprises a memory unit comprising a look-up-table (LUT), the LUT comprising a compensation parameter for compensating for inter-symbol interference.

The foregoing summary is provided by way of illustration and is not intended to be limiting.

BRIEF DESCRIPTION OF DRAWINGS

The accompanying drawings are not intended to be drawn to scale. In the drawings, each identical or nearly identical component that is illustrated in various figures is represented by a like numeral. For purposes of clarity, not every component may be labeled in every drawing.

FIG. 1C is a plot illustrating a plurality of signals exhibiting different amounts of inter-symbol interference.

DETAILED DESCRIPTION

I. Overview

The inventors have recognized and appreciated that some delta-sigma analog-to-digital converters (ADC) suffer from inter-symbol interference. Inter-symbol interference is a phenomenon that arises in delta-sigma ADCs when "memory effects" arise. This is the case, for example, when the digital-to-analog converter, that is part of the feedback loop of the delta-sigma ADC, outputs an analog signal that depends not only on the current bit, but also on the previous bit(s). One phenomenon responsible for these memory effects is timing jitter. Timing jitter occurs when the duration of a pulse is distorted due to parasitic capacitances present in the electronic circuitry. The pulse may, for example, may be stretched in time if the falling edge is delayed to a greater extent than the rising edge; or may be compressed in time if the rising edge is delayed to a greater extent than the falling edge. Inter-symbol interference can substantially degrade the performance of a delta-sigma ADC, as conversion errors are introduced.

The inventors have developed methods and circuits for operating delta-sigma ADCs in the presence of inter-symbol interference, and for mitigating the inter-symbol interference. These methods comprise measuring the amount of inter-symbol interference arising in a delta-sigma ADC during a sensing phase; during a compensation phase, compensating for inter-symbol interference based on the value obtained in the sensing phase; and during a conversion phase, using the delta-sigma ADC to convert analog signals into the digital domain. Some embodiments are directed to multi-bit delta-sigma ADCs; that is, ADCs comprising a plurality of 1-bit digital-to-analog converters (DACs), and as a result, a plurality of data paths. In these embodiments, the sensing phase and the compensation phase may be performed for each of the multiple data paths (or at least for some of the data paths).

In some embodiments, the amount of inter-symbol interference in a delta-sigma ADC may be sensed by: (1) causing the ADC to generate a first number of transitions during a first time interval; (2) causing the ADC to generate a second number of transitions during a second time interval; (3) sensing the number of logic-0s and/or logic-1s occurring in the first and second time intervals; and (4) computing a value indicative of the inter-symbol interference based at least in part on the number of logic-0s and/or logic-1s occurring in the first and second time intervals. In some embodiments, compensation of inter-symbol interference may be performed by re-shaping the pulses based on the value obtained in the sensing phase. One way to re-shape the pulses is by controlling the time at which a rising edge and/or a falling edge occurs.

As explained above, inter-symbol interference may arise in a delta-sigma ADC due to memory effects. This situation is illustrated in FIGS. 1A-1C.

II. Inter-Symbol Interference in Conventional Delta-Sigma ADCs

Figure 1A:
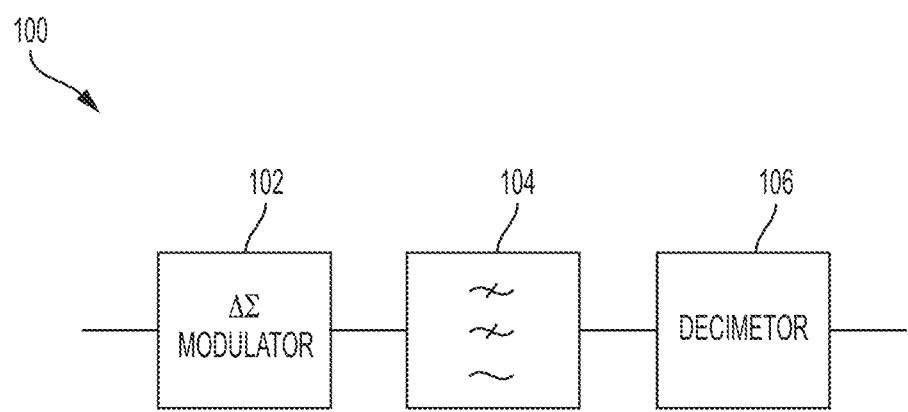
FIG. 1A is a block diagram illustrating a delta-sigma analog-to-digital converter.
Figure 1B:
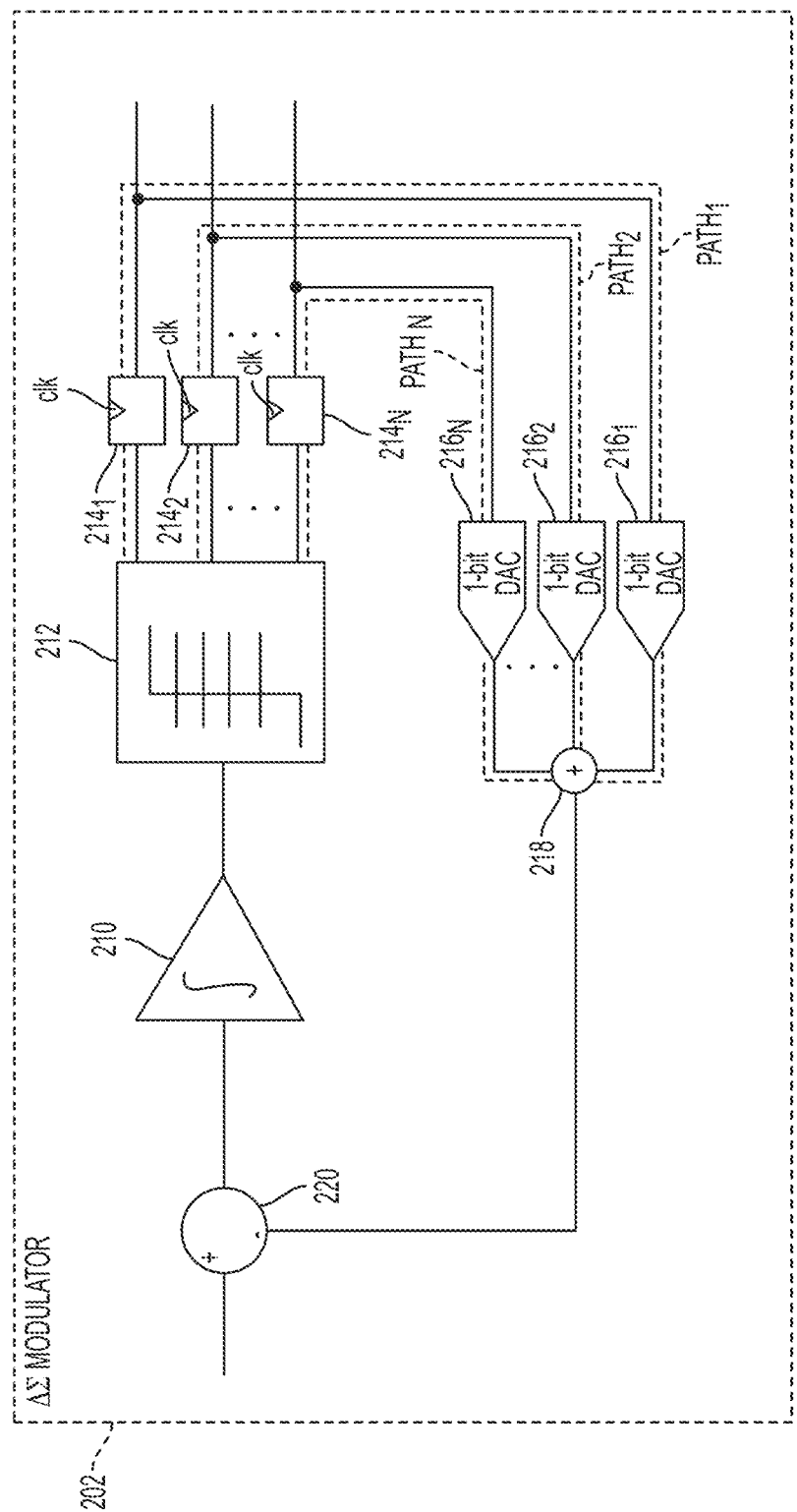
FIG. 1B is a block diagram illustrating a delta-sigma modulator.

FIG. 1A is a block diagram illustrating a delta-sigma analog-to-digital converter (ADC). Delta-sigma ADC 100 (also referred to herein simply as "ADC 100"), includes delta-sigma modulator 102, low-pass filter 104 and decimator 106. Delta-sigma modulator 102 produces a stream of bits in response to receiving an input analog signal. If the delta-sigma modulator is properly designed, the spectrum of the noise is primarily shifted towards the high frequencies, such that it exhibits minimal overlap with the spectrum of the quantized signal. Therefore, the noise can be eliminated using low-pass filter 104. Decimator 106 takes the sampled data and converts it into a high-resolution, slower digital code.

Delta-sigma modulator 102 can be designed to produce a 1-bit stream or a multi-bit stream. Compared to 1-bit delta-sigma ADCs, multi-bit stream delta-sigma ADCs can achieve higher conversion rates and/or higher resolutions. An exemplary multi-level delta-sigma modulator is illustrated in FIG. 1B. Delta-sigma modulator 202 includes integrator 210, N-bit quantizer 212, flip-flops $214_1$, $214_2$ ... $214_N$, 1-bit digital-to-analog converters (DAC) $216_1$, $216_2$ ... $216_N$, combiner 218 and combiner 220, which can be implemented using a comparator. Integrator 210 operates as a noise shaper: at the input terminal of integrator 210, the noise has a substantially spectral power density; at the output terminal of integrator 210, the noise has a low spectral power density in the low-frequencies and large spectral power density in the high-frequencies. The input analog signal, which is integrated by integrator 210, is quantized by N-bit quantizer 212. The output of the N-bit quantizer 212 is a data stream consisting of N bits. Each bit of the data stream is loaded in a respective flip-flop, from which is output when an edge (e.g., a rising edge or a falling edge) of clock signal clk is received. The outputs of the flip-flops are provided to low-pass filter 104 (not shown in FIG. 1B) and to 1-bit DACs $216_1$, $216_2$ ... $216_N$.

DACs $216_1$, $216_2$ ... $216_N$ are disposed in the feedback loop of delta-sigma modulator 202; that is, they are disposed between the output terminal of N-bit quantizer 212 and the input terminal of integrator 210. The feedback loop is configured to receive quantization noise introduced by N-bit quantizer 212 and to feed it back into integrator 212. Accordingly, the outputs of the DACs are combined (e.g., added) using combiner 218, and the resulting signal is subtracted from the input analog signal with combiner 220. In this way, the quantization noise, which has a substantially constant spectral power density at the output of N-bit quantizer 212, is shaped by integrator 210 to limit the spectral power density in the low-frequencies. The data paths between the output terminal of N-bit quantizer 212 and combiner 218 are referred to as "path 1", "path 2" . . . "path N".

Inter-symbol interference arises in at least some of the data paths described above, because of distortions in the duration of the pulses. These distortions may be caused, for example, by parasitic capacitances in the switches of the 1-bit DACs, in the flip-flops, or in the metal lines. In some circumstances, the different data paths may suffer from inter-symbol by different amounts.

The manner in which inter-symbol interference arises is illustrated in FIG. 1C. Signals $230_1$, $230_2$ and $230_N$ are the signals corresponding to paths 1, 2 and N, respectively. In this example, signal $230_1$ exhibits a rising edge at time t1 and a falling edge at time t2. In this example, it is assumed that signal $230_1$ does not exhibit inter-symbol interference. In the absence of inter-symbol interference, signals $230_2$ and $230_N$ would also have rising edges occurring at t1 and falling edges occurring at t2. However, signal $230_2$ has a rising edge that occurs after t1 by $\Delta T_{2R}$ and a falling edge that occurs after t2 by $\Delta T_{2F}$; and signal $230_N$ has a rising edge that occurs after t1 by $\Delta T_{NR}$ and a falling edge that occurs at t2. Inter-symbol interference may be represented as the difference between $\Delta T_{2F}$ and $\Delta T_{2R}$. The distortion in the time at which the edges occur may accumulate over time, and therefore the edges of a pulse may leak into subsequent pulses, thus causing contiguous symbols to interfere with each other. As a result, bit errors may arise. Since the duration of the pulses in signals $230_2$ and $230_N$ are distorted by different amounts, the two signals exhibit different values of inter-symbol interference.

Methods and Circuits for Compensating for Inter-Symbol Interference

Figure 2:
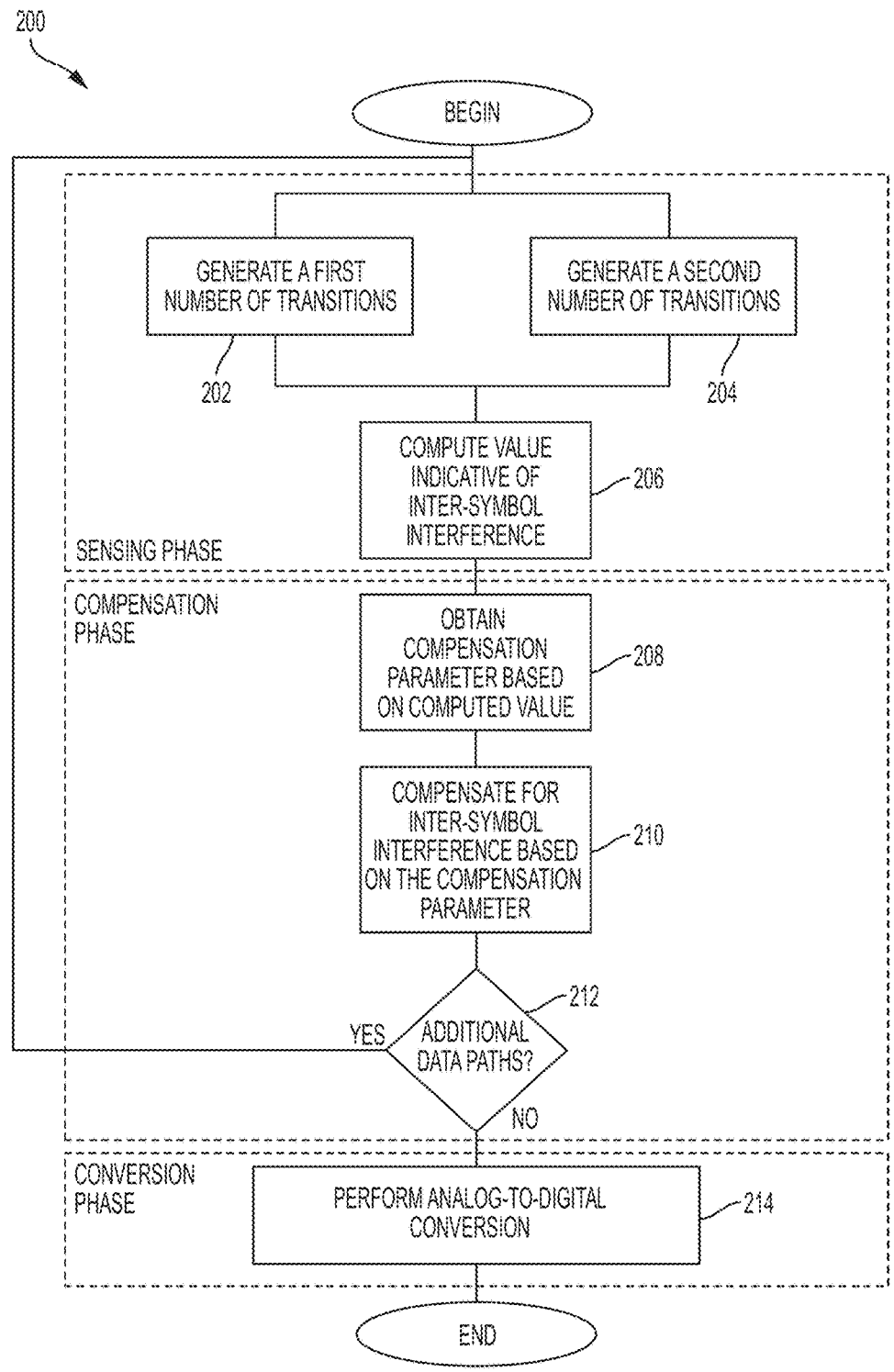
FIG. 2 is a flowchart illustrating a method of operating a delta-sigma modulator in the presence of inter-symbol interference, according to some non-limiting embodiments.
Figure 3:
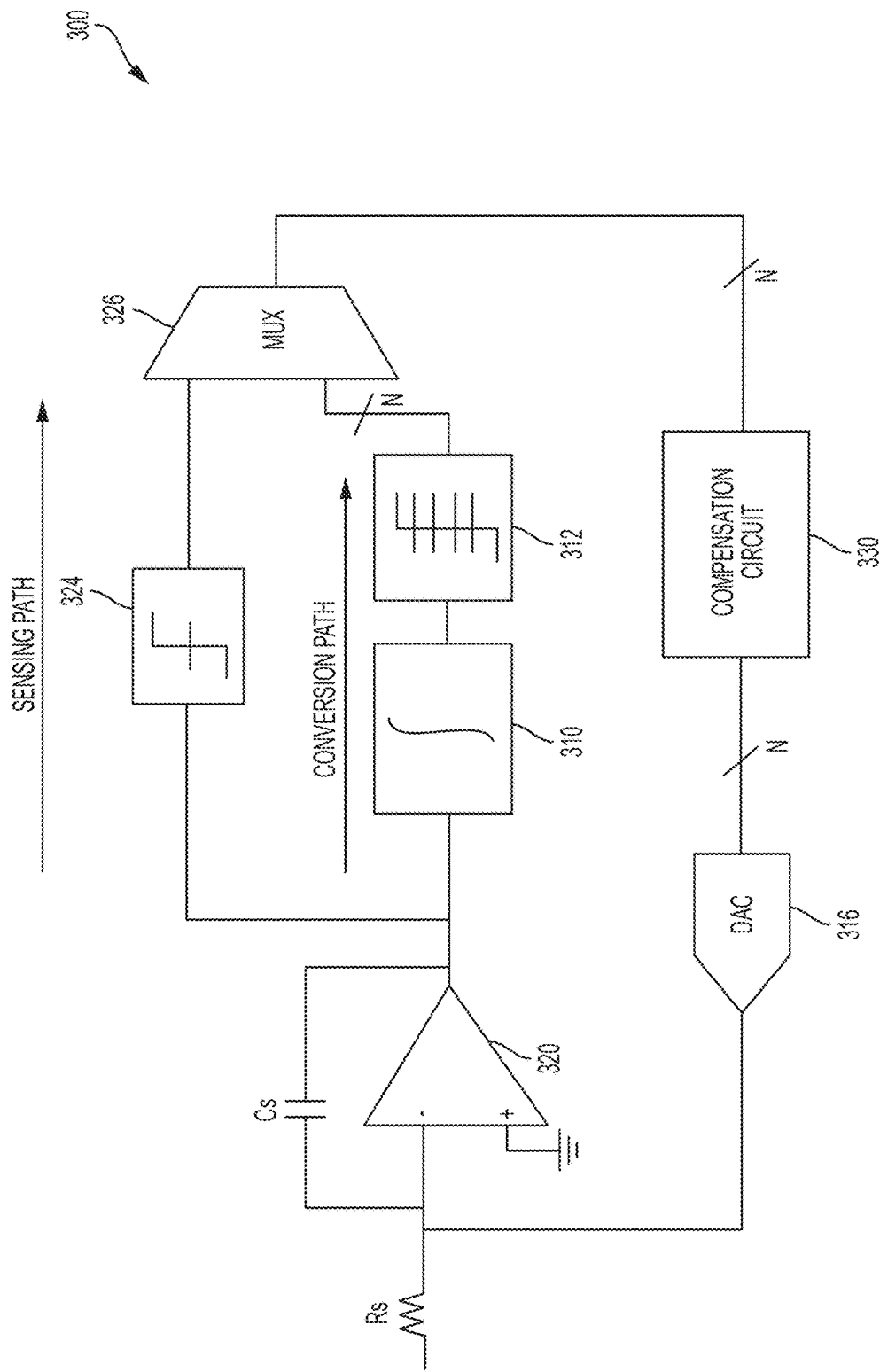
FIG. 3 is a block diagram illustrating a delta-sigma modulator comprising a sensing path and a conversion path, according to some non-limiting embodiments.

Some embodiments of the present application are directed to methods and circuits for compensating for inter-symbol interference in delta-sigma ADCs. A representative method 200 for operating a delta-sigma ADC is depicted in FIG. 2, and a representative delta-sigma modulator according to some embodiments is depicted in FIG. 3. Delta-sigma modulator 300 includes integrator 310 (or alternatively, another type of low-pass filter of any suitable order), N-bit quantizer 312 (with N greater than or equal to 1), 1-bit quantizer 324, multiplexer 326, DAC 316 (which may include N 1-bit DACs), operational amplifier 320, resistor $R_s$, capacitor $C_s$, and compensation circuit 330. As illustrated, a conversion path is formed by integrator 310 and N-bit quantizer 312, and a sensing path is formed by 1-bit quantizer 324. While not illustrated in FIG. 3, delta-sigma modulator 300 may include flip-flops arranged as illustrated in FIG. 1B. Examples of compensation circuits 330 are described further below. As in the case illustrated in FIG. 1A, delta-sigma modulator 300 may be used in connection with a low-pass filter and a decimator. As described below, during the sensing phase, multiplexer 326 may activate the sensing path by selecting the output of 1-bit quantizer 324; and during the conversion phase, multiplexer 326 may activate the conversion path by selecting the output of N-bit quantizer 312.

Accordingly, method 200 includes a sensing phase, a compensation phase, and a conversion phase. In the sensing phase, the inter-symbol interference may be measured. In particular, in act 202, a sample data stream having a first number of transitions may be generated in the sensing path, and in act 204, another sample data stream having a second number of transitions may be generated in the sensing path. The two data streams may have substantially equal durations (e.g., with a difference in duration that is less than the inverse of the carrier frequency of either one of the data streams) in some embodiments. It should be appreciated that either rising edges or falling edges may be used as transitions. In some embodiments, transitions may be generated by inputting a direct current (DC) input to the delta-sigma modulator 300 and by activating the sensing path. Since the number of transitions is different in the two cases, but the durations of the data streams are substantially equal, the number of logic-1s and logic-0s arising in act 202 may generally differ from the number of logic-1s and logic-0s arising in act 204. This difference may be used, in some embodiments, to infer the inter-symbol interference of the delta-sigma modulator, which may be caused in some embodiments by parasitics in the DAC 316. For example, in act 206, a value indicative of the inter-symbol interference may be computed based on these numbers. In a specific example, the transitions are generated, during acts 202 and 204, with an input signal having a value equal to $DC_{in}$ throughout M clock cycles. In act 202, N transitions are generated, and as a result, P logic-1s are generated and Q logic-0s are generated. In act 204, N' transitions are generated, and as a result, P' logic-1s are generated and Q' logic-0s are generated. In act 202, the product M times $DC_{in}$ is equal to:

$$M \times DC_{in} = (1 \times P) + (0 \times Q) - (\varepsilon_{ISI} \times N)$$

where $\varepsilon_{ISI}$ is the inter-symbol interference. In act 204, the product M times $DC_{in}$ is equal to:

$$M \times DC_{in} = (1 \times P') + (0 \times Q') - (\varepsilon_{ISI} \times N')$$

In act 206, the inter-symbol interference $\varepsilon_{ISI}$ may be computed by combining the two equations above. This results in the following equation:

$$(1 \times P) - (\varepsilon_{ISI} \times N) = (1 \times P') - (\varepsilon_{ISI} \times N')$$

Solving for $\varepsilon_{ISI}$, the following expression is obtained:

$$\varepsilon_{ISI} = (P - P')/(N - N')$$

where, again, N and N' are the number of transitions in acts 202 and 204, respectively; and P and P' are the number of transitions in acts 202 and 204, respectively. Those of ordinary skill in the art will appreciate that, in some circumstances, the various data paths of a multi-bit delta-sigma ADC may exhibit different amounts of inter-symbol interference. As such, the sensing phase and the compensation phase may be applied to each of the N data paths (corresponding to each of the N 1-bit DACs) independently.

In the compensation phase, inter-symbol interference may be compensated based, at least in part, on the value obtained in the sensing phase. In some embodiments, inter-symbol interference is compensated based on a compensation parameter. The compensation parameter may be computed based on $\varepsilon_{ISI}$, in act 208. In some embodiments, the compensation parameter may be obtained from a look-up-table (LUT). The LUT may be populated to map values of the compensation parameters with values of $\varepsilon_{ISI}$. A representative LUT is illustrated in table 1, in which for each value of $\varepsilon_{ISI}$, a value for the compensation parameter is provided. $\varepsilon_{ISI}$ and the compensation parameter are expressed in units of picoseconds. The LUT may be stored in a memory unit. It should be appreciated that the values of table 1 are provided solely by way of example. In some embodiments, the compensation parameter may mirror the value of $\varepsilon_{ISI}$.

TABLE 1

| $\varepsilon_{ISI}$ (psec) | Compensation parameter (psec) |
|---|---|
| 0.4 | 3.6 |
| 0.8 | 4.0 |
| 1.2 | 4.4 |
| ... | ... |
| 3.2 | 6.2 |

In some embodiments, values for the compensation parameter are pre-computed, for example, by minimizing bit error rate (BER) in the presence of inter-symbol interference. Of course, other methods may be used to pre-compute values for the compensation parameter as a function of $\varepsilon_{ISI}$.

In act 210, inter-symbol interference may be compensated by applying the compensation parameter. In the embodiments in which N>1, if it is determined, in act 212, that one or more data paths have not been sensed or compensated, method 200 is repeated for the next data path. In there are no other data paths that have not been sensed or compensated, method 200 proceeds to the conversion phase. In this phase, the conversion path is activated, and analog-to-digital conversion is performed in act 214.

III. Examples of Circuits for Sensing Inter-Symbol Interference

Figure 4A:
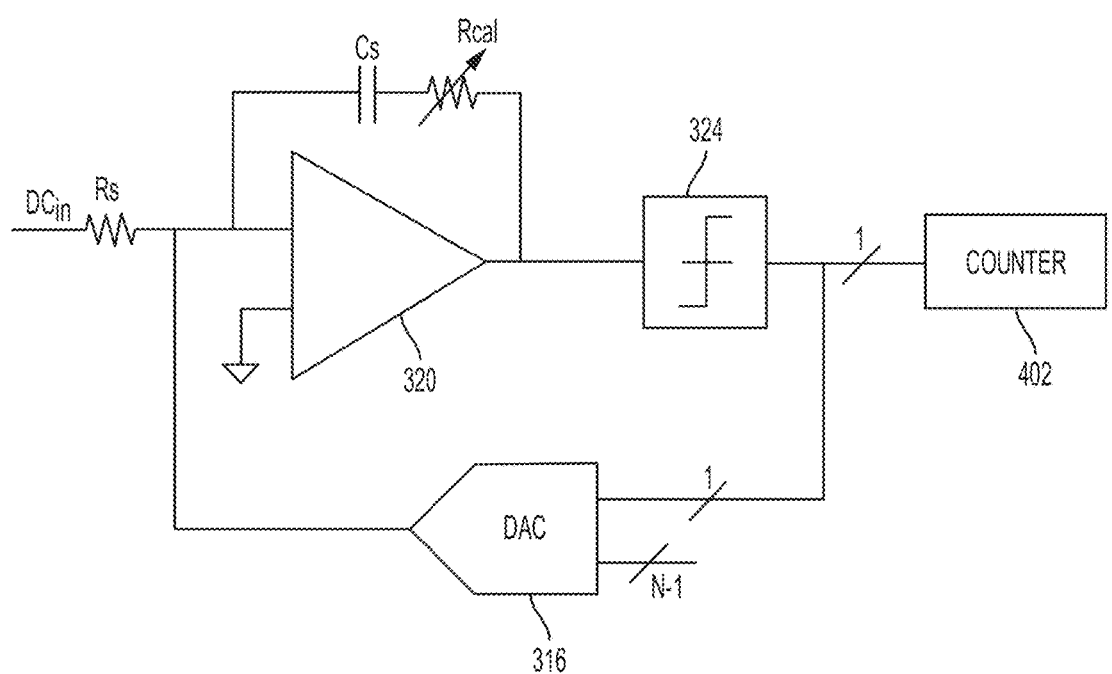
FIGS. 4A-4E are block diagrams illustrating representative circuits for varying the number of transitions in a data stream, according to some non-limiting embodiments.

As described above, inter-symbol interference may be measured, in some embodiments, by passing two data streams through the sensing path in two time intervals having substantially the same duration. The first data stream may have a first number of transitions and the second data stream may have a second number of transitions. A first representative circuit for generating different number of transitions is depicted in FIG. 4A. In addition to operational amplifier 320, 1-bit quantizer 324, DAC 316, resistor $R_s$ and capacitor $C_S$, the illustrated embodiment includes variable resistor $R_{cal}$ and counter 402. For the sake of clarity, the conversion path and multiplexer 326 are not illustrated. As illustrated, a DC input $DC_{in}$ is provided for M clock cycles, and in response, a stream of bits is generated. During a first time interval of M clock cycles, a resistance value for resistor $R_{cal}$ is selected. In this time interval, the bit stream exhibits N transitions, P logic-1s and Q logic-0s. During a second time interval of M clock cycles, the resistance of resistor $R_{cal}$ is varied. Since the change in resistance causes a change in the signal presented to 1-bit quantizer 324, a different bit stream is generated. The resulting bit stream exhibits N' transitions, P' logic-1s and Q' logic-0s. In the first and second time intervals, the number of transitions, logic-1s and logic-0s are measured using counter 402. As described above, $\varepsilon_{ISI}$ may be obtained based on these values. The technique described herein may be repeated for each one (or at least for some) of the N data paths, in the embodiments in which N>1.

Figure 4B:
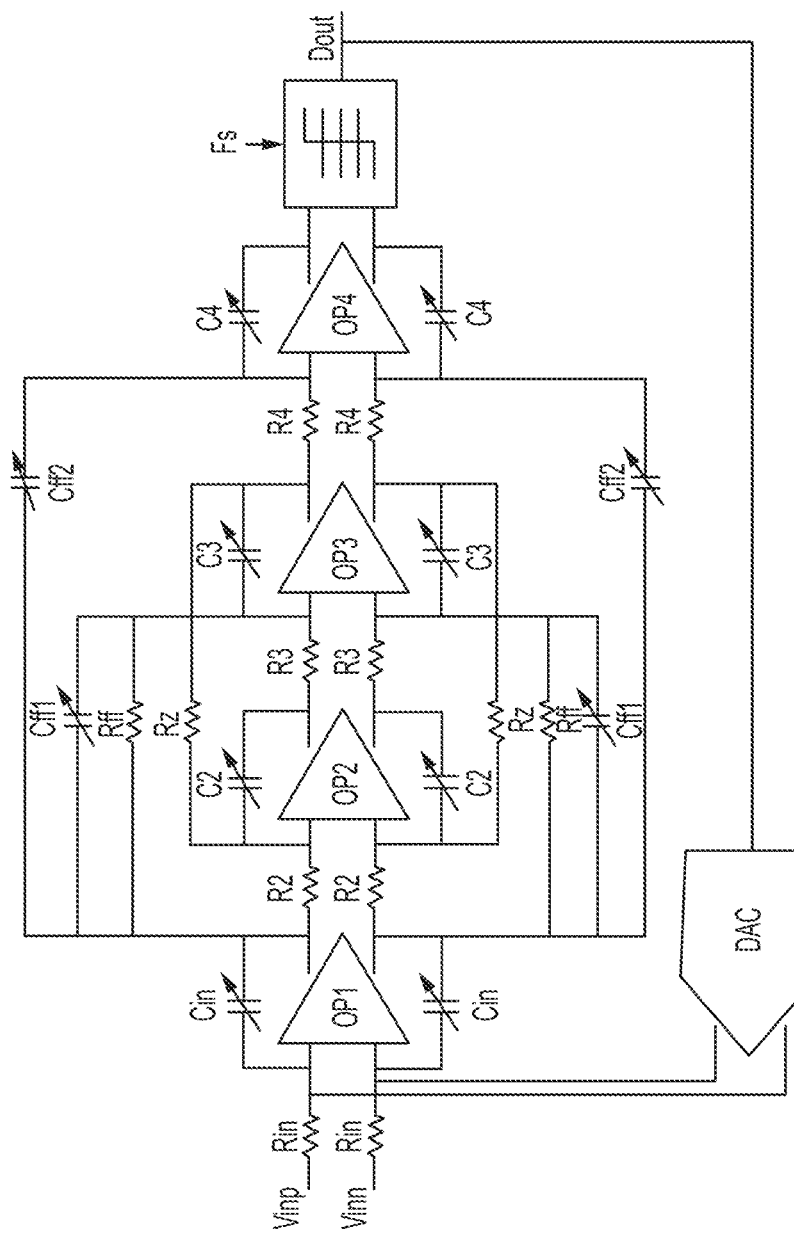

A second representative circuit for sensing inter-symbol interference is depicted in FIG. 4B. As illustrated, this circuit includes a plurality of operational amplifiers OP1, OP2, OP3 and OP4 exhibiting different out-of-band gains (OBG). It should be appreciated that any other suitable number of operational amplifiers may be used. Because the OBGs are different, the outputs of the analog-to-digital converter exhibit different high-frequency contents. As a result, different number of transitions may be generated. The circuit is depicted in a differential configuration, but single-ended configurations may alternatively be used.

Figure 4D:
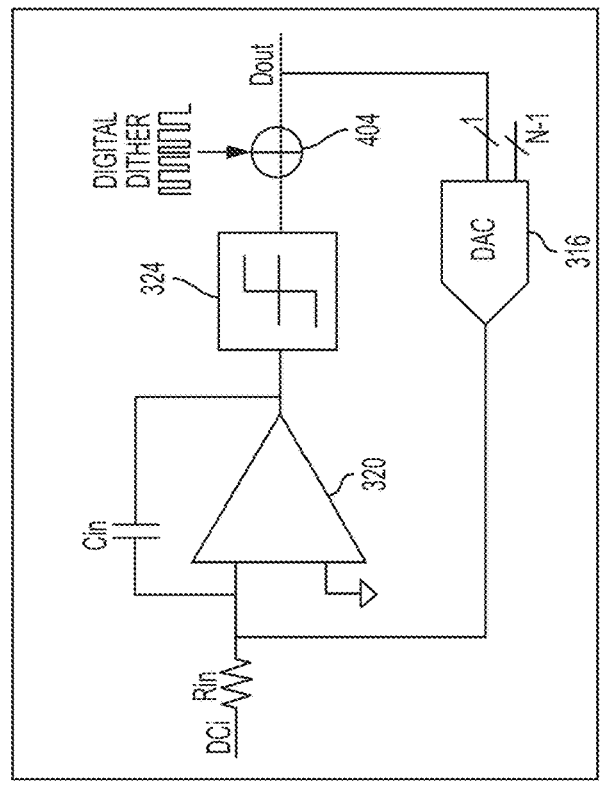
Figure 4C:
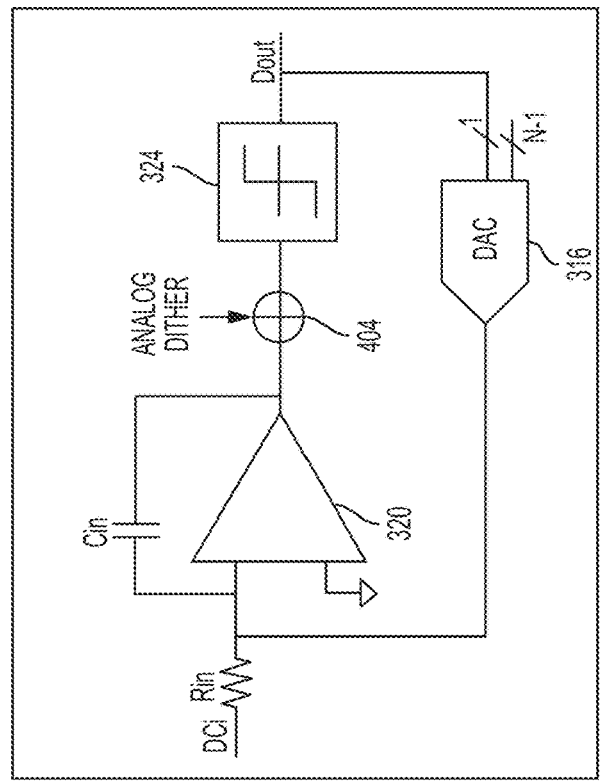

A third and a fourth representative circuit for sensing inter-symbol interference are illustrated in FIGS. 4C and 4D, respectively. In these circuits, a random signal is introduced in the sensing path using combiner 404. In the embodiment of FIG. 4C, an analog dither signal is introduced; in the embodiment of FIG. 4D, a digital dither signal is introduced. Whether using an analog or a digital dither, the introduced signal may be configured to have a low low-frequency spectral content and a large high-frequency spectral content. In this way, the DC input is substantially unchanged, but the random nature of the dither signals causes different number of transitions, at the output, at different time intervals.

Figure 4E:
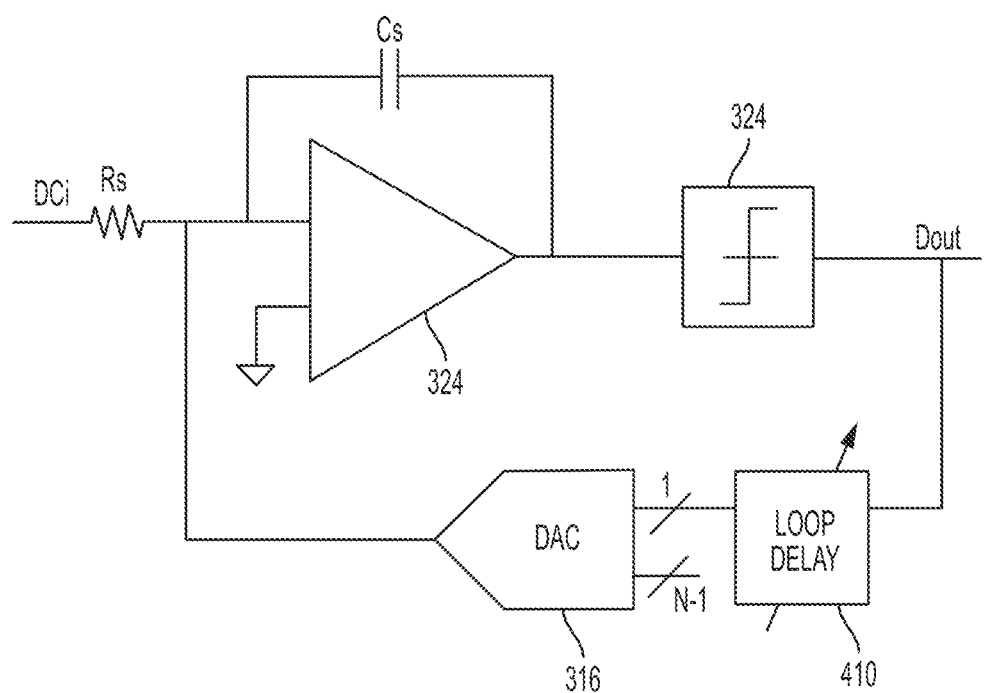

A fifth representative circuit for sensing inter-symbol interference is illustrated in FIG. 4E, in which an adjustable loop delay 410 is introduced along the sensing path. In this embodiment, the amount of delay introduced by adjustable loop delay 410 is varied between the first time interval and the second time interval. In this way, different number of transitions are produced.

IV. Examples of Compensation Circuits

Figure 5:
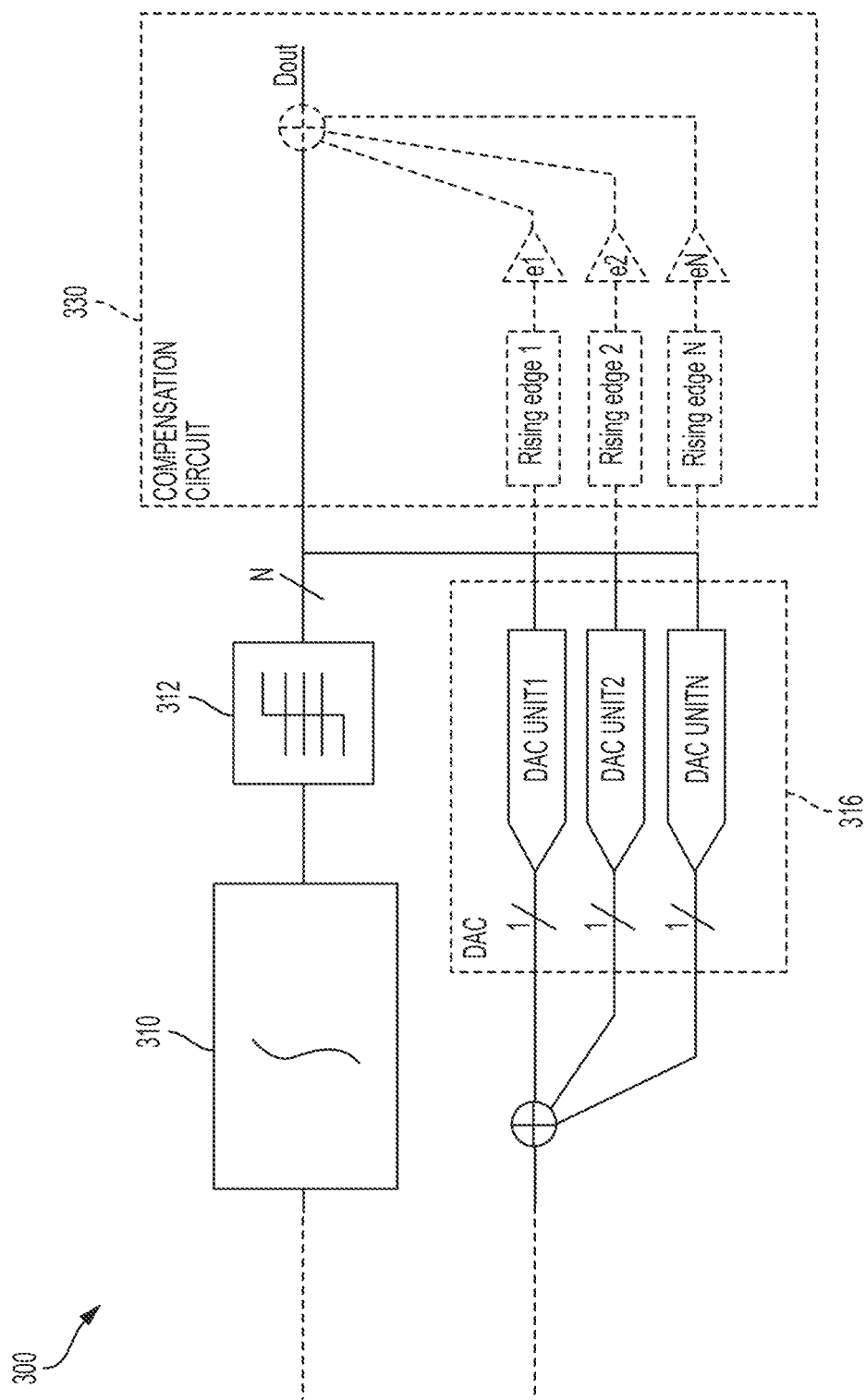
FIG. 5 is a block diagram illustrating a representative compensation circuit, according to some non-limiting embodiments.
Figure 6:
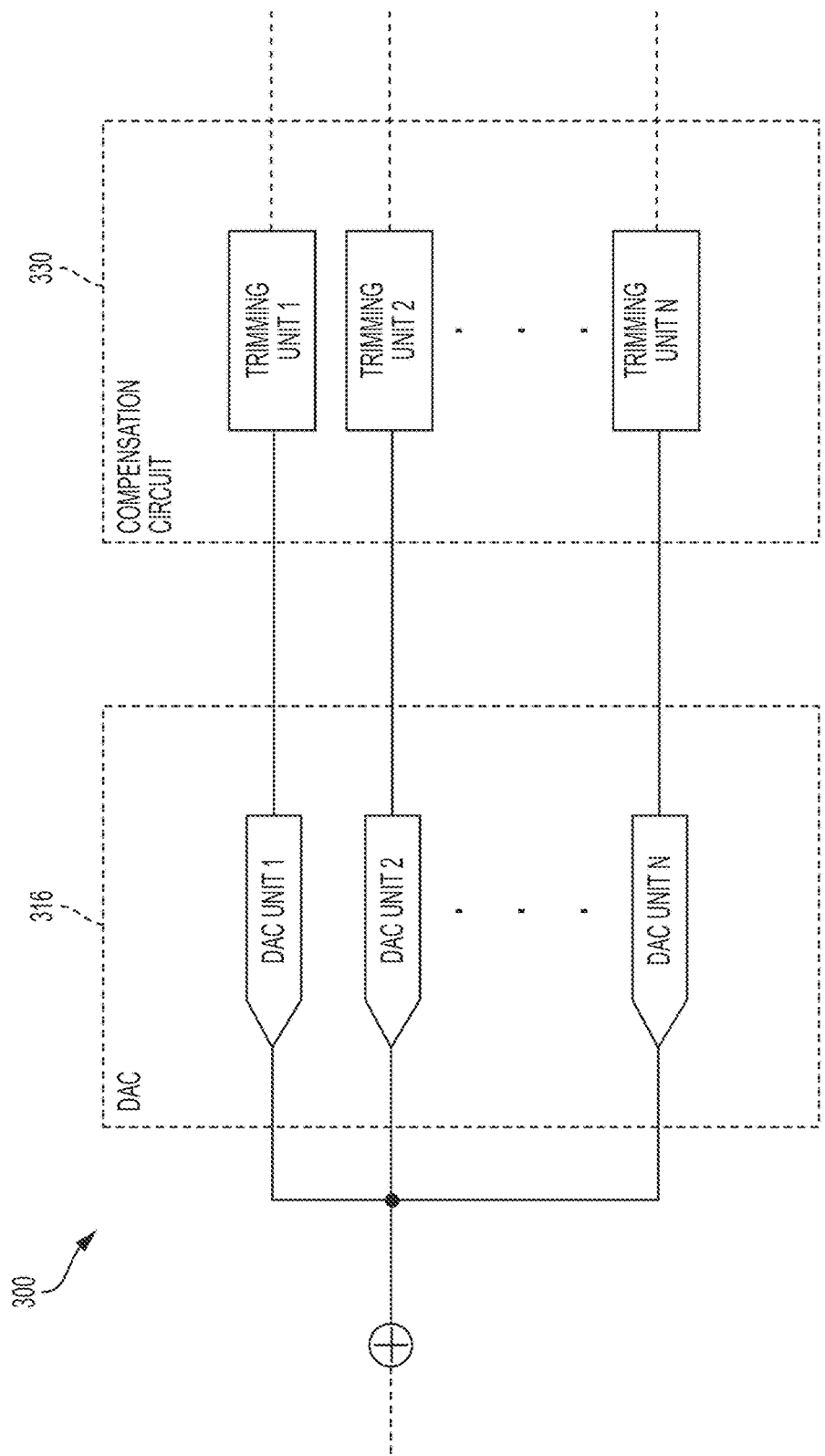
FIG. 6 is a block diagram illustrating another representative compensation circuit, according to some non-limiting embodiments.

A representative compensation circuit is illustrated in FIG. 5. In this case, compensation circuit 330 includes N rising edge detectors (or alternatively, N falling edge detectors), and N amplifiers (labelled e1, e2 . . . eN). The rising edge detectors may be configured to detect rising edges (or falling edges in the case of falling edge detectors) in the signals provided by N-bit quantizer 312. In one example, the rising edge detectors output a logic 1 when a rising edge is received. The amplifiers may be configured to provide an amplitude gain e1, e2 . . . eN that depend on the amount of ISI detected. For example, assuming that an ISI equal to 10 ps is detected with a bit periodicity of 1 ns (such that the ISI is 1% of the bit periodicity), the gain amplitude may be set to 1.01. In some embodiments, the greater the detected ISI, the greater the amplitude gain of the amplifiers. The signals obtained through the rising edge detectors and the amplifiers may be combined with the output of the N-bit quantizer 312 to obtain an output that is compensated for ISI. In one example, the output of the N-bit quantizer 312 is added to the outputs of the amplifiers. Another representative compensation circuit is illustrated in FIG. 6. In this case, compensation circuit 330 includes N trimming units. Each trimming unit is arranged such that its output is coupled to a corresponding DAC unit in DAC 316. Each trimming unit may be adjusted, based on a compensation parameter obtained as described above, to control the time at which a rising edge and/or a falling edge occurs, so as to compensate for inter-symbol interference. The trimming units may be implemented in any of numerous ways.

Figure 7:
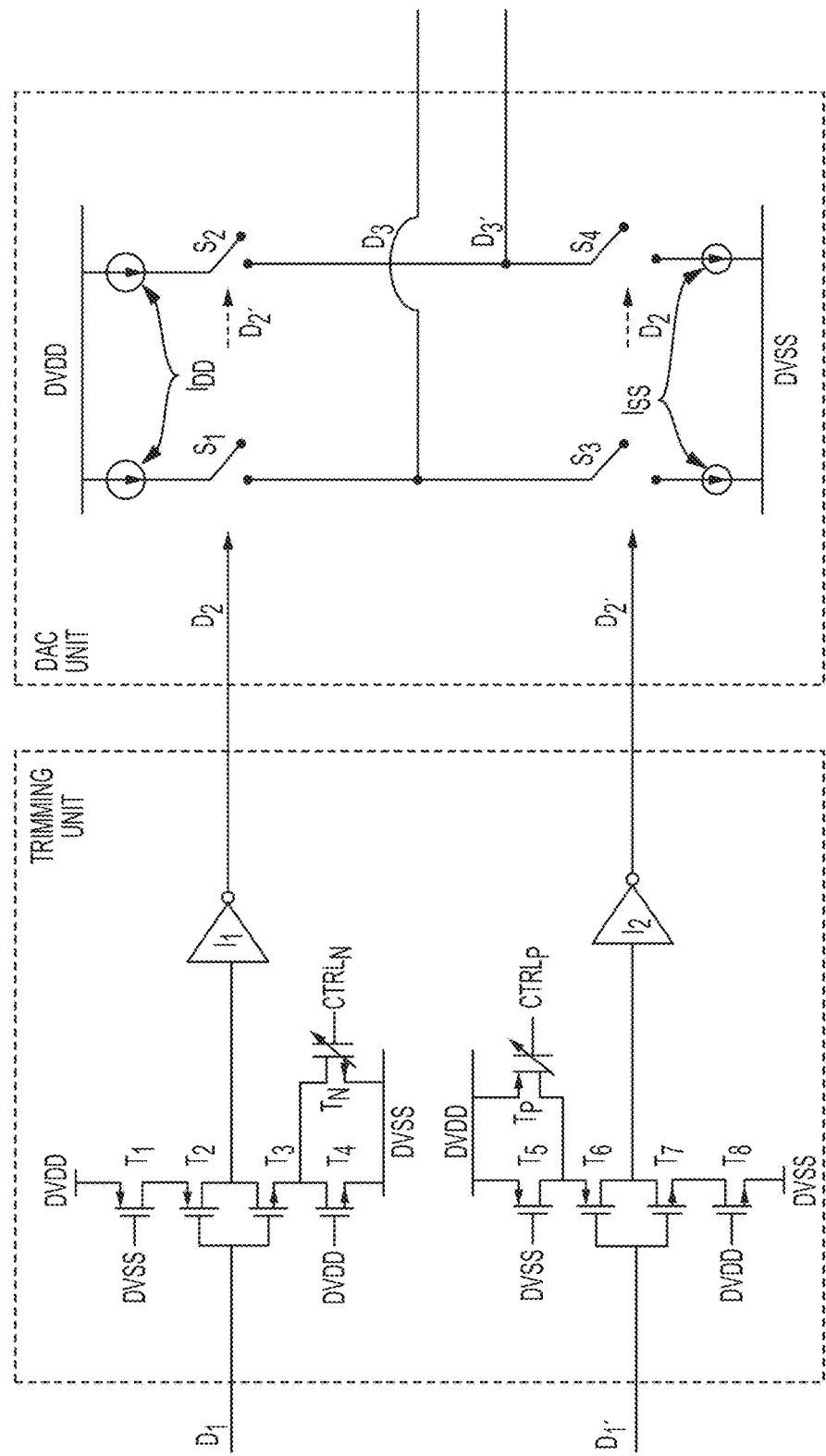
FIG. 7 is a block diagram illustrating a representative trimming circuit, according to some non-limiting embodiments.

A non-limiting differential implementation of a trimming unit and a DAC unit is illustrated in FIG. 7. A differential signal D1/D1' is applied to the trimming circuit. The trimming circuit includes transistors T1, T2, T3, T4 and Tn, which are configured to adjust the time at which a rising edge occurs, and transistors T5, T6, T7, T8 and Tp, which are configured to adjust the time at which a falling edge occurs. Accordingly, the timing of a rising edge can be varied by changing the source current of Tn, using control signal CTRLn. Similarly, the timing of a falling edge can be varied by changing the source current of Tp, using control signal CTRLp. The appropriate values for CTRLn and CTRLp may be determined based on the compensation parameter described above. The output of transistors T2 and T3 may be fed to inverter I1, which produces signal D2.

Similarly, output of transistors T6 and T7 may be fed to inverter 12, which produces signal D2'. Differential signal D2/D2' is provided as input to the DAC unit.

The DAC unit is implemented using switches S1, S2, S3, and S4 and current sources Idd and Iss. It should be appreciated that, while two separate current sources are illustrated for Idd, in some embodiments, a single current source may be shared between the two arms of the DAC (a similar arrangement may be applied to current source Iss). In one state, switches si and S4 are closed, and switches S2 and S3 are open. In this case, positive current of Idd is charge to the node D3 and negative current of Iss is discharged from node D3. In the other state, S2 and S3 are closed and si and S4 are open. In this case, the currents are delivered in the opposite direction.

Various aspects of the apparatus and techniques described herein may be used alone, in combination, or in a variety of arrangements not specifically discussed in the embodiments described in the foregoing description and is therefore not limited in its application to the details and arrangement of components set forth in the foregoing description or illustrated in the drawings. For example, aspects described in one embodiment may be combined in any manner with aspects described in other embodiments.

Use of ordinal terms such as "first", "second", "third", etc., in the claims to modify a claim element does not by itself connote any priority, precedence, or order of one claim element over another or the temporal order in which acts of a method are performed, but are used merely as labels to distinguish one claim element having a certain name from another element having a same name (but for use of the ordinal term) to distinguish the claim elements.

Also, the phraseology and terminology used herein is for the purpose of description and should not be regarded as limiting. The use of "including", "comprising", "having", "containing" or "involving" and variations thereof herein, is meant to encompass the items listed thereafter and equivalents thereof as well as additional items.

The use of "coupled" or "connected" is meant to refer to circuit elements, or signals, that are either directly linked to one another or through intermediate components.

What is claimed is:

1. A method for compensating a circuit for inter-symbol interference (ISI), the method comprising:
    in a first time interval:
        causing the circuit to generate a first data stream having a first number of transitions, and
        determining a first number of zeros and/or ones that are output by the circuit in the first time interval;
    in a second time interval:
        causing the circuit to generate a second data stream having a second number of transitions, and
        determining a second number of zeros and/or ones that are output by the circuit in the second time interval;
    determining a value indicative of an ISI by comparing the first number of zeros and/or ones with the second number of zeros and/or ones; and
    compensating the circuit for inter-symbol interference based on the value,
    wherein the circuit comprises an analog-to-digital converter (ADC).

2. The method of claim 1, wherein the ADC comprises a delta-sigma ADC.

3. A method for compensating a circuit for inter-symbol interference (ISI), the method comprising:
    in a first time interval:
        causing the circuit to generate a first data stream having a first number of transitions, and
        determining a first number of zeros and/or ones that are output by the circuit in the first time interval;
    in a second time interval:
        causing the circuit to generate a second data stream having a second number of transitions, and
        determining a second number of zeros and/or ones that are output by the circuit in the second time interval;
    determining a value indicative of an ISI by comparing the first number of zeros and/or ones with the second number of zeros and/or ones; and
    compensating the circuit for inter-symbol interference based on the value,
    wherein the first time interval has a first duration and the second time interval has a second duration that is substantially equal to the first duration.

4. The method of claim 1, wherein determining the value indicative of the ISI error comprises searching a look up table.

5. A method for compensating a circuit for inter-symbol interference (ISI), the method comprising:
    in a first time interval:
        causing the circuit to generate a first data stream having a first number of transitions, and
        determining a first number of zeros and/or ones that are output by the circuit in the first time interval;
    in a second time interval:
        causing the circuit to generate a second data stream having a second number of transitions, and
        determining a second number of zeros and/or ones that are output by the circuit in the second time interval;
    determining a value indicative of an ISI by comparing the first number of zeros and/or ones with the second number of zeros and/or ones; and
    compensating the circuit for inter-symbol interference based on the value,
    wherein causing the circuit to generate the first data stream and causing the circuit to generate the second data stream comprises introducing a dither signal.

6. The method of claim 1, wherein the ISI arises in a digital-to-analog converters (DAC).

7. The method of claim 1, further comprising converting the first and second data streams into the analog domain through one or more digital-to-analog converters (DAC).

8. The method of claim 1, wherein compensating the circuit comprises controlling a time at which a rising edge or a falling edge occurs.

9. A circuit comprising:
    an integrator;
    an N-bit quantizer coupled to an output of the integrator, wherein N is greater than or equal to 1;
    a feedback loop coupled between an output of the N-bit quantizer and an input of the integrator, the feedback loop comprising one or more digital-to-analog converters (DAC);
    a compensation circuit coupled to the one or more DACs; and
    control circuitry configured to measure an ISI arising in the one or more DACs and to control the compensation circuit based on the ISI,
    wherein the integrator, the feedback loop, the N-bit quantizer and the plurality of DACs form a delta-sigma analog-to-digital converter (ADC), wherein each of the one or more DACs comprises a single-bit DAC.

10. A circuit comprising:
an integrator;
an N-bit quantizer coupled to an output of the integrator, wherein N is greater than or equal to 1;
a feedback loop coupled between an output of the N-bit quantizer and an input of the integrator, the feedback loop comprising one or more digital-to-analog converters (DAC);
a compensation circuit coupled to the one or more DACs; and
control circuitry configured to measure an ISI arising in the one or more DACs and to control the compensation circuit based on the ISI,
wherein the control circuitry is configured to measure the ISI by:
in a first interval:
generating a first data stream having a first number of transitions, and
determining a first number of zeros and/or ones that are part of the first data stream in the first time interval;
in a second time interval:
generating a second data stream having a second number of transitions, and
determining a second number of zeros and/or ones that are part of the second data stream in the second time interval.

11. The circuit of claim 10, wherein the first time interval has a first duration and the second time interval has a second duration that is substantially equal to the first duration.

12. The circuit of claim 10, wherein the control circuitry is further configured to determine the ISI error by:
determining a value indicative of the ISI by comparing the first number of zeros and/or ones with the second number of zeros and/or ones.

13. A delta-sigma modulator comprising:
a conversion path comprising a low-pass filter, and an N-bit quantizer coupled to an output of the low-pass filter, wherein N is greater than or equal to 1;
a sensing path comprising a 1-bit quantizer;
circuitry for activating the conversion path during a conversion phase and for activating the sensing path during a sensing phase;
a feedback loop coupled between an output of the N-bit quantizer and an input of the low-pass filter, the feedback loop comprising one or more digital-to-analog converters (DAC); and
a compensation circuit coupled to the one or more DACs, wherein the compensation circuit comprises one or more trimming circuits configured to control timing of a rising edge and/or a falling edge.

14. A delta-sigma modulator comprising:
a conversion path comprising a low-pass filter, and an N-bit quantizer coupled to an output of the low-pass filter, wherein N is greater than or equal to 1;
a sensing path comprising a 1-bit quantizer and a controllable device;
circuitry for activating the conversion path during a conversion phase and for activating the sensing path during a sensing phase;
a feedback loop coupled between an output of the N-bit quantizer and an input of the low-pass filter, the feedback loop comprising one or more digital-to-analog converters (DAC); and
a compensation circuit coupled to the one or more DAC.

15. A delta-sigma modulator comprising:
a conversion path comprising a low-pass filter, and an N-bit quantizer coupled to an output of the low-pass filter, wherein N is greater than or equal to 1;
a sensing path comprising a 1-bit quantizer;
circuitry for activating the conversion path during a conversion phase and for activating the sensing path during a sensing phase;
a feedback loop coupled between an output of the N-bit quantizer and an input of the low-pass filter, the feedback loop comprising one or more digital-to-analog converters (DAC);
a compensation circuit coupled to the one or more DACs; and
a memory unit comprising a look-up-table (LUT), the LUT comprising a compensation parameter for compensating for inter-symbol interference.

16. The delta-sigma modulator of claim 14, wherein the low-pass filter is an integrator.

17. The method of claim 3, wherein determining the value indicative of the ISI error comprises searching a look up table.

18. The method of claim 3, wherein compensating the circuit comprises controlling a time at which a rising edge or a falling edge occurs.

19. The method of claim 5, wherein compensating the circuit comprises controlling a time at which a rising edge or a falling edge occurs.

20. The method of claim 5, wherein the ISI arises in a digital-to-analog converters (DAC).

* * * * *